US010827615B1

(12) United States Patent
Choi et al.

(10) Patent No.: US 10,827,615 B1
(45) Date of Patent: Nov. 3, 2020

(54) PRINTED CIRCUIT BOARD

(71) Applicant: SAMSUNG ELECTRO-MECHANICS CO., LTD., Suwon-si (KR)

(72) Inventors: Jong Chan Choi, Suwon-si (KR); Young Kwon Jeong, Suwon-si (KR); Min Soo Kim, Suwon-si (KR); Seong Jae Mun, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 0 days.

(21) Appl. No.: 16/817,780

(22) Filed: Mar. 13, 2020

(30) Foreign Application Priority Data

Jan. 6, 2020 (KR) .................... 10-2020-0001424

(51) Int. Cl.
*H05K 1/11* (2006.01)
*H05K 1/02* (2006.01)

(52) U.S. Cl.
CPC ........... *H05K 1/115* (2013.01); *H05K 1/0298* (2013.01); *H05K 2201/09536* (2013.01)

(58) Field of Classification Search
CPC ................ H05K 1/115; H05K 1/0298; H05K 2201/09536
USPC ....................................................... 174/262
See application file for complete search history.

(56) References Cited

U.S. PATENT DOCUMENTS

| | | | | |
|---|---|---|---|---|
| 8,552,312 | B2* | 10/2013 | Kawai | H05K 3/423 |
| | | | | 174/264 |
| 8,785,790 | B2* | 7/2014 | Uzoh | H01L 23/49827 |
| | | | | 174/262 |
| 2002/0182398 | A1* | 12/2002 | Matsuda | H05K 3/4069 |
| | | | | 428/304.4 |
| 2009/0236230 | A1 | 9/2009 | Reents et al. | |
| 2014/0042032 | A1 | 2/2014 | Shimoyama et al. | |
| 2015/0034378 | A1* | 2/2015 | Kajihara | H05K 3/427 |
| | | | | 174/266 |
| 2017/0250132 | A1* | 8/2017 | Mohammed | H01L 23/53252 |
| 2019/0103288 | A1 | 4/2019 | Cho et al. | |
| 2019/0357364 | A1* | 11/2019 | Lutschounig | H05K 1/0206 |

FOREIGN PATENT DOCUMENTS

| | | |
|---|---|---|
| JP | 2015-29027 A | 2/2015 |
| KR | 10-1222627 B1 | 1/2013 |
| KR | 10-1653438 B1 | 9/2016 |
| KR | 10-2019-0038269 A | 4/2019 |

* cited by examiner

*Primary Examiner* — Sherman Ng
(74) *Attorney, Agent, or Firm* — Morgan, Lewis & Bockius LLP (57) ABSTRACT

A printed circuit board includes a substrate having a first surface and a second surface, opposite to the first surface, and having a through-portion penetrating between the first surface and the second surface; and a through-via disposed in at least a portion of the through-portion, wherein the through-via includes a first metal layer having a first groove portion facing an interior of the through-portion from the first surface of the substrate and a second groove portion facing the interior of the through-portion from the second surface of the substrate, and the first metal layer has a first region, and a second region, having different average grain sizes.

20 Claims, 8 Drawing Sheets

PRINTED CIRCUIT BOARD

CROSS-REFERENCE TO RELATED APPLICATION(S)

This application claims benefit of priority to Korean Patent Application No. 10-2020-0001424 filed on Jan. 6, 2020 in the Korean Intellectual Property Office, the disclosure of which is incorporated herein by reference in its entirety.

TECHNICAL FIELD

The present disclosure relates to a printed circuit board.

BACKGROUND

In the case of using a thick core substrate, or in the case of a multilayer substrate, a conductive material may be formed along a wall of a via hole, and a via filled with an insulating material may be used, such as a plated through-hole (PTH). However, in this case, there is a problem that reliability and heat dissipation characteristics of a product may be reduced due to the introduction of the insulating material.

In addition, in the case of a multilayer substrate, it may be considered to use a stacked via or a staggered via in which a plurality of vias are connected in a vertical direction. However, even in this case, a process may be complicated and manufacturing costs may be increased, and defects such as cracks, delamination, and the like, of vias, may occur.

Therefore, it is desirable to form a filled-type via in a through-portion penetrating the thick core substrate or the multilayer substrate, but voids may occur when plating is performed to fill the through-portion in a simple manner.

SUMMARY

An aspect of the present disclosure is to provide a printed circuit board including a filled-type through-via without voids.

Another aspect of the present disclosure is to provide a printed circuit board having improved heat dissipation characteristics and reliability.

According to an aspect of the present disclosure, a printed circuit board includes: a substrate having a first surface and a second surface, opposite to the first surface, and a through-portion penetrating between the first surface and the second surface; and a through-via filling at least a portion of the through-portion, wherein the through-via includes a first groove portion facing an interior of the through-portion from the first surface of the substrate and a second groove portion facing an interior of the through-portion from the second surface of the substrate, and the first metal layer has a first region, and a second region, having different average grain sizes.

According to an aspect of the present disclosure, a printed circuit board includes: a substrate having a first surface and a second surface, opposite to the first surface, and having a through-portion penetrating between the first surface and the second surface; and a through-via disposed in at least a portion of the through-portion. The through-via comprises first grains and second grains. A region, in which the first grains are disposed, is disposed between regions in which the second grains are disposed. The first grains and the second grains having different average grain sizes. A width of each of the regions in which the second grains are disposed, first increases and then decreases in a direction from the first surface to second surface or from the second surface to the first surface.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments of the present disclosure will be described as follows with reference to the attached drawings.

Printed Circuit Board

Figure 1:
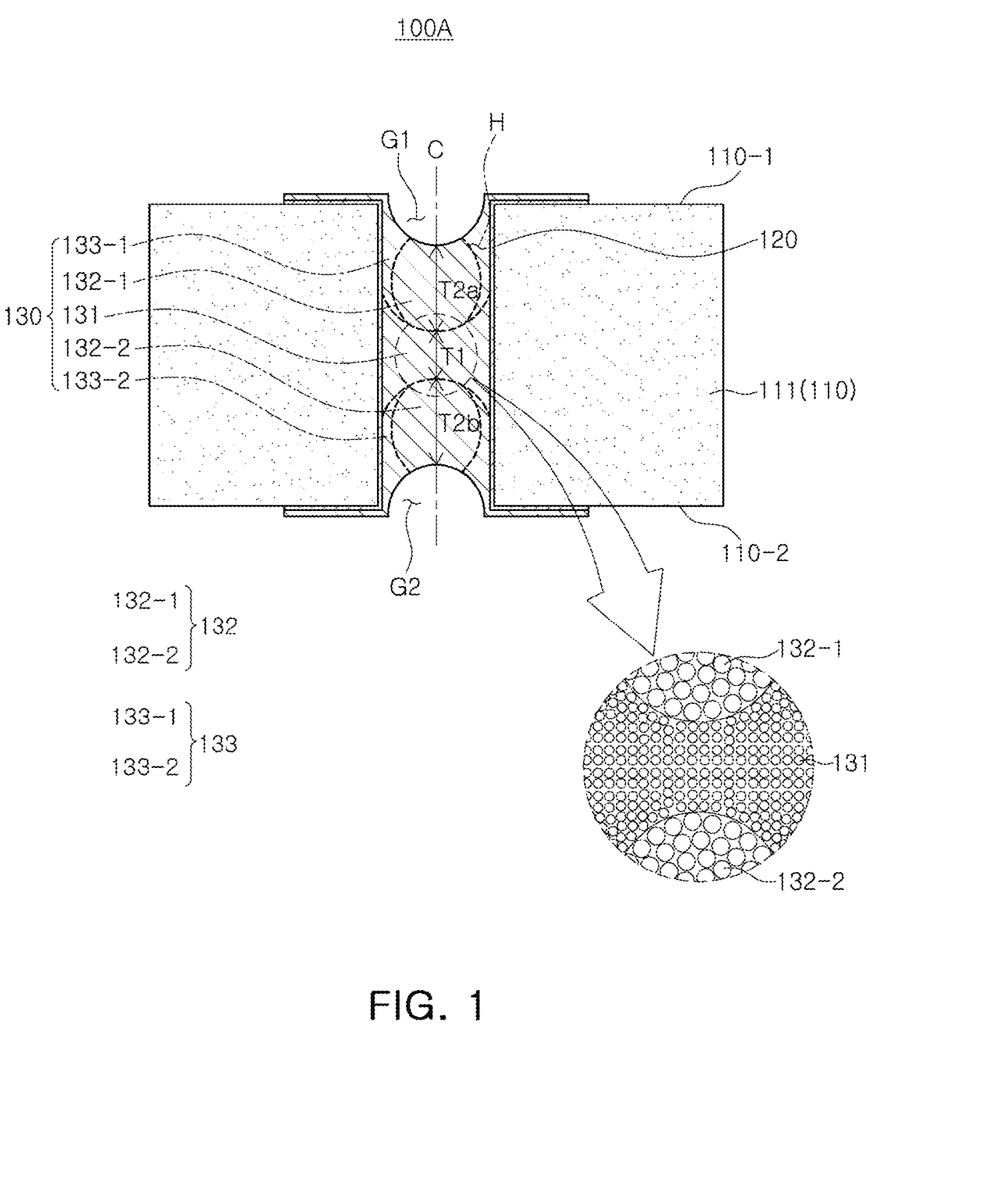
FIG. 1 is a schematic cross-sectional view of a first plating layer of a printed circuit board 100A according to an example.

FIG. 1 is a schematic cross-sectional view of a first plating layer of a printed circuit board 100A according to an example.

Figure 2:
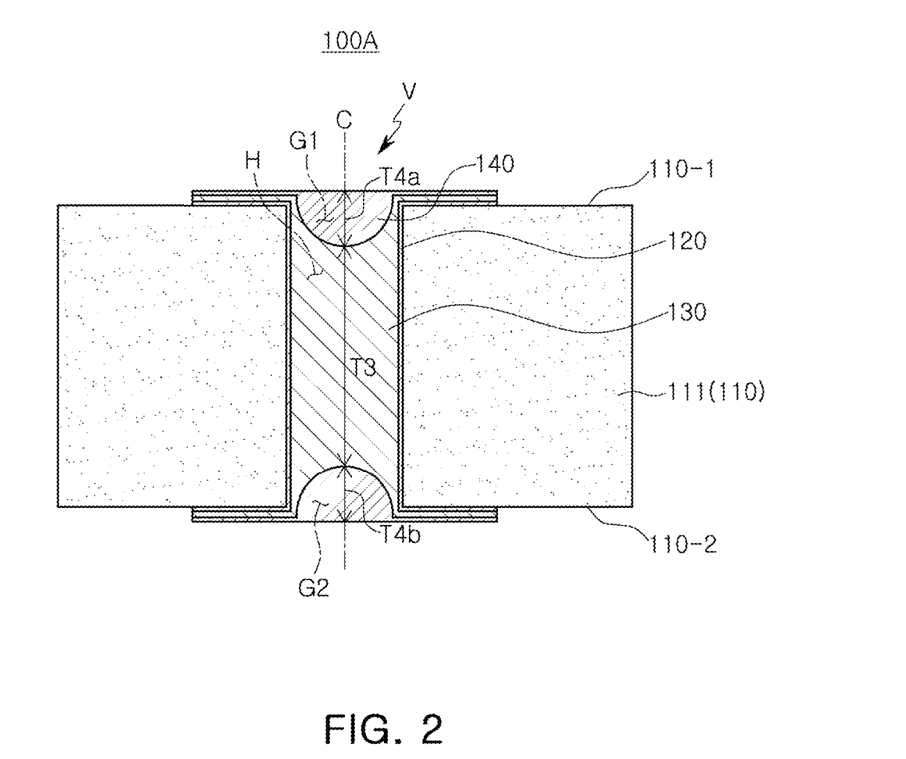
FIG. 2 is a schematic cross-sectional view of a printed circuit board 100A according to an example.

FIG. 2 is a schematic cross-sectional view of a printed circuit board 100A according to an example.

Figure 3A:
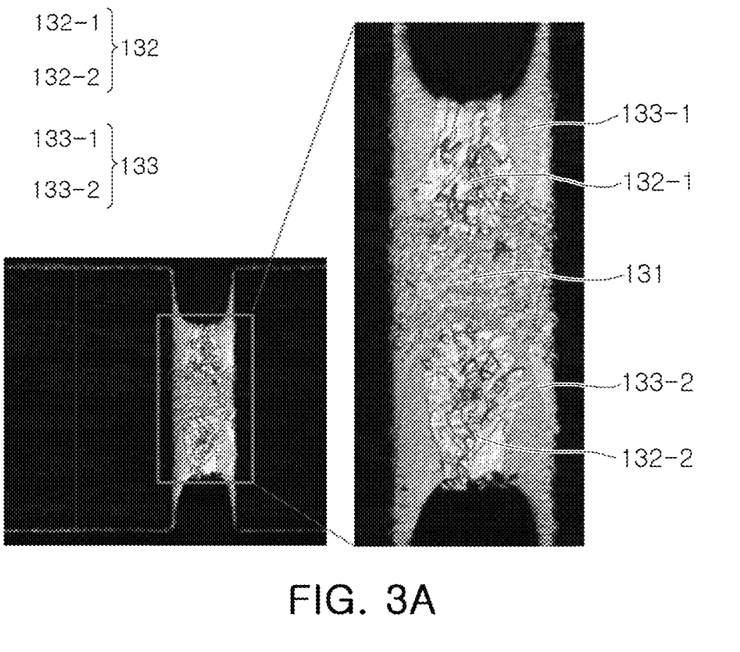
FIGS. 3A-3B is a cross-sectional photograph of a first plating layer and a second plating layer of a printed circuit board 100A according to an example.
Figure 3B:
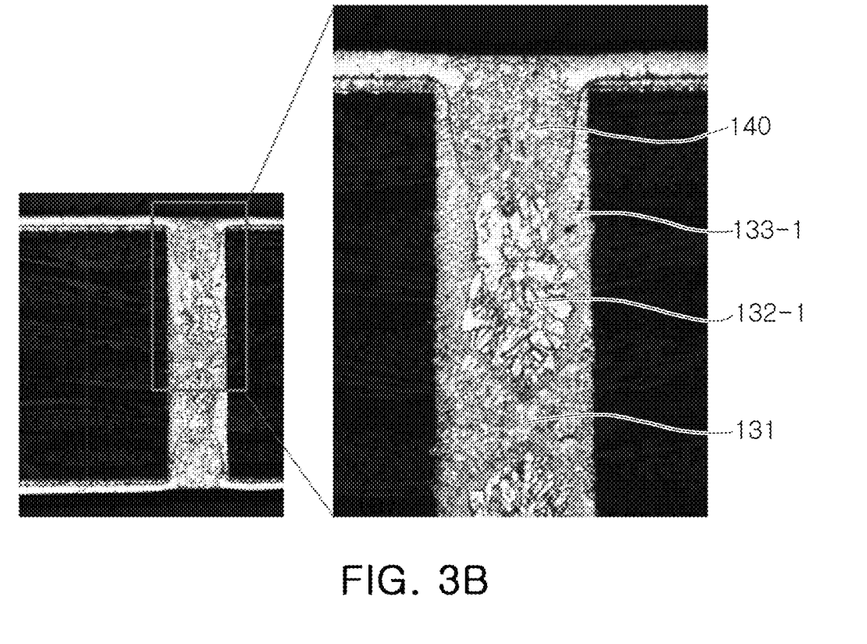

FIGS. 3A-3B is a schematic cross-sectional photograph of a first plating layer and a second plating layer of a printed circuit board 100A according to an example.

Referring to the drawings, a printed circuit board according to an example may include: a substrate 110 having a first surface 110-1 and a second surface 110-2, opposite to the first surface 110-1, and having a through-portion H penetrating between the first surface 110-1 and the second surface 110-2; and a through-via V filling at least a portion of the through-portion H.

The through-via V may include a first metal layer 120, a second metal layer 130, and a third metal layer 140.

The first metal layer 120 may be disposed on a wall surface (not labeled) of the through-portion H, the first surface 110-1 of the substrate 110, and the second surface 110-2 of the substrate 110, respectively, and may be covered with the second metal layer 130.

The second metal layer 130 may fill at least a portion of the through-portion H of the substrate 110, and may have a first groove portion G1 facing an interior of the through-portion H from the first surface 110-1 of the substrate 110 and a second groove portion G2 facing an interior of the through-portion H from the second surface 110-2 of the substrate 110. A shape of each of the first groove portion G1 and the second groove portion G2 is not particularly limited. In the drawings, each of the first groove portion G1 and the second groove portion G2 is illustrated as having a smooth curved shape, but is not limited thereto.

In addition, the second metal layer 130 may have a first region 131, a second region 132, and a third region 133. The second region 132 may have a second-first region 132-1 and a second-second region 132-2, and the third region 133 may include a third-first region 133-1 and a third-second region 133-2. A boundary between the first region 131, the second region 132, and the third region 133 may not be clear, and it may be difficult to determine the correct boundary with the naked eye. A shape of a boundary surface of the first region 131, the second region 132, and the third region 133 of the second metal layer 130 is not particularly limited. In the drawings, the boundary surface between the first region 131, the second region 132, and the third region 133 is illustrated as having a smooth curved shape, but is not limited thereto.

The first region 131 of the second metal layer 130 may be disposed in a central portion of the substrate 110 in a thickness direction thereof. Accordingly, the second region 132 and the third region 133 may be further disposed on both sides of the first region 131 in the through-portion H. Meanwhile, the central portion may be a term for describing a relative dispositional relationship between the first region 131, the second region 132, and the third region 133, and it may not be construed as being limited to a center of the first surface 110-1 and the second surface 110-2 of the substrate 110.

A surface of the first region 131 of the second metal layer 130 may have a structure in which a region corresponding to a central axis C of the through-via V is concave into the through-portion H.

The second region 132 of the second metal layer 130 may include a second-first region 132-1 facing an interior of the second metal layer 130 from the surface of the first groove portion G1 and a second-second region 132-2 facing the interior of the second metal layer 130 from the surface of the second groove portion G2. In addition, the first region 131 may be disposed between the second-first region 132-1 and the second-second region 132-2 of the second metal layer 130.

Each of the second-first region 132-1 and the second-second region 132-2 of the second metal layer 130 may have a convex shape in which a width of a cross-section facing the interior of the second metal layer 130 from the surface of each of the first groove portion G1 and the second groove portion G2 decreases after increasing.

In the present specification, a width may mean a distance measured in a direction, perpendicular to the direction of the second surface 110-2 from the first surface 110-1 of the substrate 110 or the direction of the first surface 110-1 from the second surface 110-2 of the substrate 110 in a cross-section.

The third region 133 of the second metal layer 130 may include a third-first region 133-1 extending from the wall surface of the through-portion H and surrounding at least a portion of the second-first region 132-1 and a third-second region 133-2 extending from the wall surface of the through-portion H and surrounding at least a portion of the second-second region 132-2. For example, the third-first region 133-1 may fill at least a portion of a space between the wall surface of the through-portion H and the second-first region 132-1. Similarly, the third-second region 133-21 may fill at least a portion of a space between the wall surface of the through-portion H and the second-second region 132-2.

Meanwhile, the first region 131, the second region 132, and the third region 133 of the second metal layer 130 may have different average grain sizes.

An average grain size 131 of the first region 131 may be smaller than an average grain size of the second region 132. If necessary, an average grain size of the third region 133 may be smaller than the average grain size of the second region 132. For example, the second metal layer 130 may have the largest average grain size in the second region 132.

The average grain size of the first region 131 may be larger than the average grain size of the third region 133, the average grain size of each of the first region 131 and the third region 133 may be substantially similar. However, the present disclosure is not limited thereto, and the average grain size of the first region 131 may be smaller than the average grain size of the third region 133.

The large and small average grain sizes are based on an average value of the grain sizes included in each region. The average grain size may be based on an average particle diameter of the grains included in each region.

Meanwhile, a thickness $T2a$ of the second-first region 132-1 and a thickness $T2b$ of the second-second region 132-2 of the second metal layer 130 may be greater than a thickness $T1$ of the first region 131. That is, a relationship, $T2a+T2b>T1$, may be satisfied. In addition, each of the thickness $T2a$ of the second-first region 132-1 and the thickness $T2b$ of the second-second region 132-2 of the second metal layer 130 may be thicker than the thickness $T1$ of the first region 131.

In the present specification, a thickness may mean a distance measured in a direction from the first surface 110-1 of the substrate 110 to the second surface 110-2 or in a direction from the second surface 110-2 to the first surface 110-1 of the substrate 110. In addition, the thickness may be measured in a region corresponding to a central axis C of the through-via V.

The third metal layer 140 may be disposed on the second metal layer 130, and may fill at least a portion of each of the first groove portion G1 and the second groove portion G2.

A thickness $T3$ of the second metal layer 130 may be greater than a sum of a thickness $T4a$ of a region filling the first groove portion G1 of the third metal layer 140 and a thickness $T4a$ of a region filling the second groove portion G2 of the third metal layer 140. That is, a relationship, $T3>T4a+T4b$, may be satisfied. Here, the thickness $T3$ of the second metal layer 130 may be equal to $T1+T2a+T2b$, which is a sum of the thicknesses of the first region and the second region. In addition, the thickness $T3$ of the second metal layer 130 may be greater than each of the thickness $T4a$ of a region filling the first groove portion G1 of the third metal layer 140 and the thickness $T4b$ of a region filling the second groove portion G2 of the third metal layer 140.

Meanwhile, each of the first metal layer 120, the second metal layer 130, and the third metal layer 140 may extend onto the first surface 110-1 and the second surface 110-2 of the substrate 110, respectively, and be disposed. Thereby, each of the first metal layer 120, the second metal layer 130, and the third metal layer 140 may form a via land and/or a wiring pattern.

Meanwhile, in the case of using a thick core substrate or a multilayer substrate, a conductive material may be formed along a wall of a via hole and a via in which an interior of the via hole is filled with an insulating material, for example, a plated through hole (PTH), may be used. However, in this case, there is a problem that the reliability and heat dissipation characteristics of a product are reduced due to an introduction of the insulating material.

In addition, in the case of a multilayer structure, it may be considered to use a stacked via or a staggered via in which a plurality of vias are connected in a vertical direction.

However, even in this case, there is a problem that a process may be complicated and manufacturing costs may be increased and also defects such as cracks, delamination, and the like, of vias, may occur.

Therefore, it is desirable to form a filled-type via in a through-portion penetrating the thick core substrate or the multilayer substrate, but voids may occur when plating is performed to fill an interior of the through-portion in a simple manner.

However, according to the present disclosure, a growth rate of plating grains may be finely controlled to fill the interior of the through-portion without voids, thereby forming a filled-type through-via regardless of a depth of the through-portion. Thus, the process may be simplified, manufacturing costs may be reduced, and heat dissipation characteristics and reliability of the substrate may also be improved.

Meanwhile, the substrate 110 may include an insulating layer 111. As a formation material of the insulating layer 111, a thermosetting resin such as an epoxy resin, a thermoplastic resin such as a polyimide, or a resin in which these resins are impregnated with a core such as glass cloth or glass fabric, together with an inorganic filler, for example, a prepreg (prepreg), Ajinomoto Build-up Film (ABF), FR-4, Bismaleimide Triazine (BT), and the like, can be used. If necessary, a Photo Imagable Dielectric (PID) resin may be used.

Meanwhile, as the formation material of each of the first metal layer 120, the second metal layer 130, and the third metal layer 140, a metal material such as copper (Cu), aluminum (Al), silver (Ag), tin (Sn), gold (Au), nickel (Ni), lead (Pb), titanium (Ti), or alloys thereof may be used. The formation material of each of the first metal layer 120, the second metal layer 130, and the third metal layer 140 may include the same material, and may include different materials from each other.

The first metal layer 120 may be a metal seed layer that may serve to improve a bonding force between the insulating layer and the second metal layer 130. The second metal layer 130 may be a bridge layer that primarily fills wall surfaces of the through-portion H, and may be formed by pulse periodical reverse (PPR) electroplating in which a direction of a pulse current is periodically reversed. The third metal layer 140 may be a plating layer that secondly fills the wall surfaces of the through-portion H, and may be formed by direct current (DC) electroplating.

For example, the first metal layer 120, which is a seed layer for plating by electroless plating and/or electroplating, may be formed, and then a current may be applied to the first metal layer 120 in a PPR manner so that the second metal layer 130 may be formed. In this case, a waveform condition of the PPR may have a number of steps, for example, five or more steps, and a current density and time in each step may be the same or different from each other. However, it may be preferable to maintain an average value (Iavg) of the current density be 1.5ASD or less, closely related to a plating rate from a viewpoint of controlling the growth rate of the plating grains described above. In this case, the growth rate of the plating grains may be easily controlled to have a plurality of regions 131, 132, and 133 having the above-described average grain size, and as a result, a phenomenon in which a supply of metal ions is lacking in a process of forming a bridge layer by plating may be prevented, thereby suppressing an occurrence of voids. Thereafter, plating may be performed on the second metal layer 130 in a DC manner to form the third metal layer 140. Thus, there may be a visible boundary between the first and second metal layers 120 and 130, and a visible boundary between the second and third metal layers 130 and 140. Boundaries between the above-described regions of the second metal layer 130 may also be visible.

Figure 4:
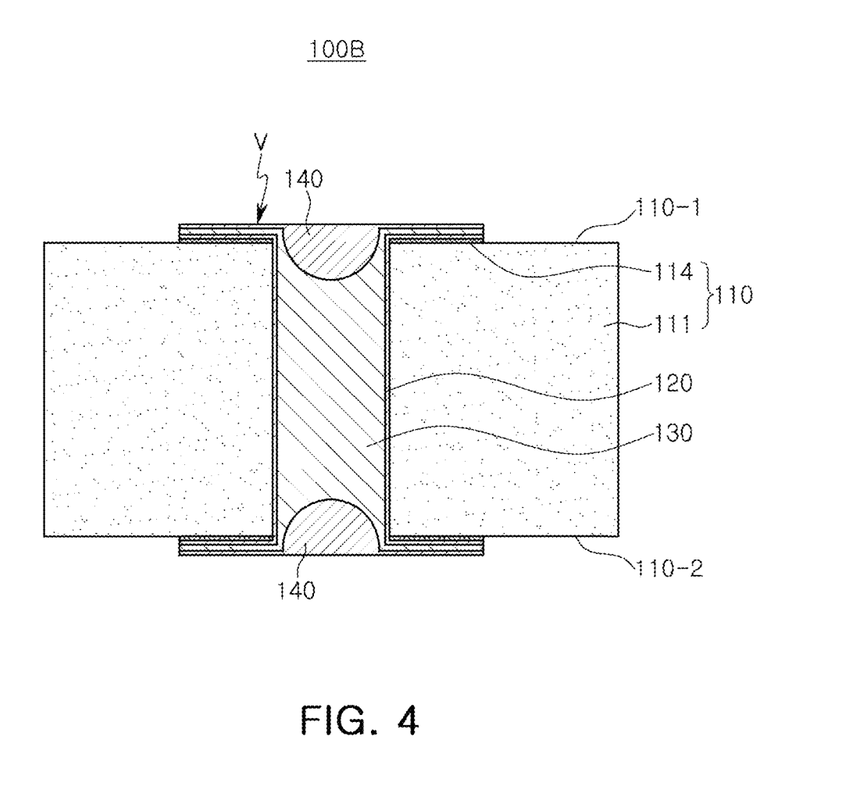
FIG. 4 is a schematic cross-sectional view of a printed circuit board 100B according to another example.

FIG. 4 is a schematic cross-sectional view of a printed circuit board 100B according to another example.

Referring to FIG. 4, in the printed circuit board 100B according to another example, the through-via V may further include a fourth metal layer 114 disposed on the first surface 110-1 and the second surface 110-2 of the substrate 110, respectively and covered with the first metal layer 120, in the printed circuit board 100A according to an example.

The substrate 110 may have an insulating layer 111 and the fourth metal layer 114 such as a metal foil, or the like, disposed on the insulating layer 111. For example, the substrate 110 may be a copper clad laminate (CCL) having a copper foil attached to one surface or both surfaces of the insulating layer 111.

Meanwhile, the unnecessary portion of the metal foil may be removed in a process such as etching, or the like, and the remaining metal foil after the removal process may become the fourth metal layer 114 shown in FIG. 4.

Other details are substantially the same as those described in the printed circuit board 100A according to an example, and detailed descriptions thereof will be omitted.

Figure 5:
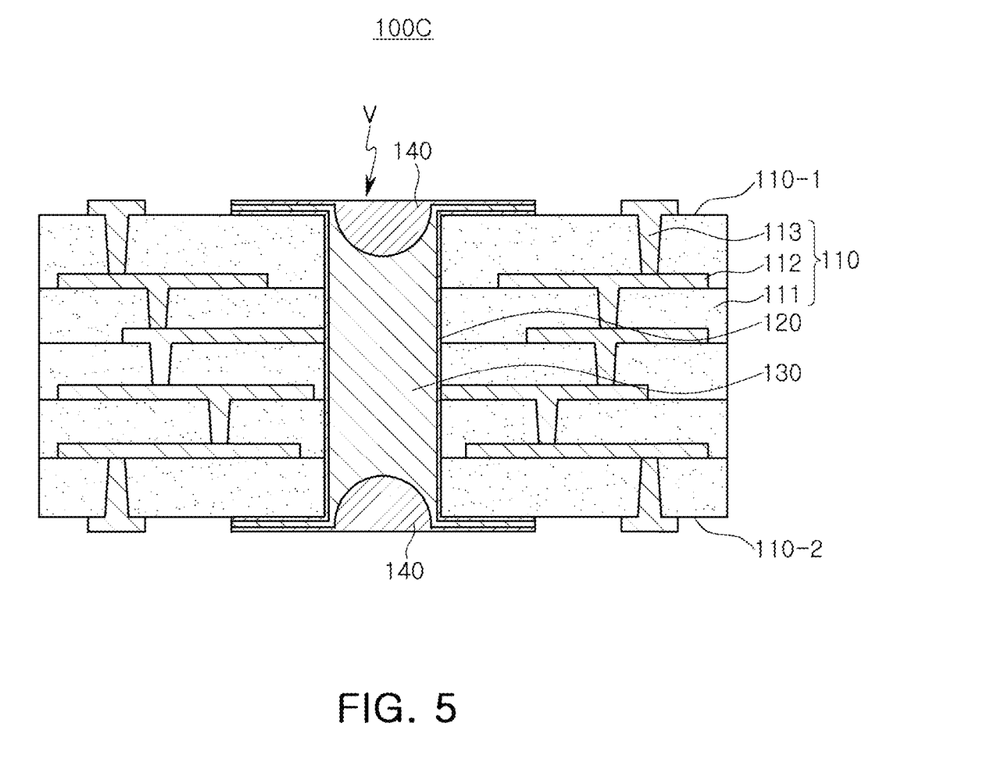
FIG. 5 is a schematic cross-sectional view of a printed circuit board 100C according to another example.

FIG. 5 is a schematic cross-sectional view of a printed circuit board 100C according to another example.

Referring to FIG. 5, in the printed circuit board 100C according to another example, the substrate 110 may include a plurality of insulating layers 111, a plurality of wiring layers 112 disposed on the plurality of insulating layers 111, respectively, and a plurality of via layers 113 penetrating each of the plurality of insulating layers 111 and connecting the plurality of wiring layers 112 to each other, in the printed circuit board 100A according to an example The number of each of the plurality of insulating layers 111, the plurality of wiring layers 112, and the plurality of via layers 113 can be changed depending on the design. That is, the number of each of the plurality of insulating layers 111, the plurality of wiring layers 112, and the plurality of via layers 113 may be larger or smaller than that shown in the drawing.

Each of the first surface 110-1 and the second surface 110-2 of the substrate 110 may be based on the insulating layer 111. Therefore, at least a portion of wiring layers 112 may be disposed on each of the first surface 110-1 and the second surface 110-2 of the substrate.

The through-via V may be formed by a plating method according to an example, and thus the through-via V penetrating a multilayer substrate without voids may be formed.

As a formation material of each of the plurality of insulating layers 111, a thermosetting resin such as an epoxy resin, a thermoplastic resin such as a polyimide, or a resin in which these resins are impregnated with a core such as glass cloth or glass fabric, together with an inorganic filler, for example, a prepreg (prepreg), Ajinomoto Build-up Film (ABF), FR-4, Bismaleimide Triazine (BT), and the like, can be used. If necessary, a Photo Imagable Dielectric (PID) resin may be used. The formation material of each of the plurality of insulating layers 111 may include the same material or different materials from each other.

Each of the plurality of wiring layers 112 may provide various wirings. Each of the plurality of wiring layers 112 may include, for example, a ground pattern, a power pattern, a signal pattern, and the like.

As a formation material of each of the plurality of wiring layers 112, a metal material such as copper (Cu), aluminum (Al), silver (Ag), tin (Sn), gold (Au), nickel (Ni), lead (Pb), titanium (Ti), or alloys thereof may be used. The formation material of each of the plurality of wiring layers 112 may include the same material, and may include different materials from each other.

Each of the plurality of wiring layers 112 may include a plurality of metal layers. For example, each of the plurality of wiring layers 112 may include a metal seed layer and a metal plating layer. The metal seed layer may be formed together with the first metal layer 120, and thus may have the same thickness as that of the first metal layer 120.

Each of the plurality of via layers 113 may perform various functions depending on the design thereof. For example, each of the plurality of via layers 113 may include a connection via for signal connection, a connection via for ground connection, a connection via for power connection, and the like.

As a formation material of a via included in each of the plurality of via layers 113, a conductive material such as copper (Cu), aluminum (Al), silver (Ag), tin (Sn), gold (Au), nickel (Ni), lead (Pb), titanium (Ti), or alloys thereof may be used. The via included in each of the plurality of via layers 113 may be a filled type via in which an interior of a via hole is completely filled with a conductive material, or the conductive material may be formed along a wall of a via hole. When the via is formed as a conductive material is formed along the wall of the via hole, an interior of the via hole may be filled with an insulating material.

In addition, the via included in each of the plurality of via layers 113 may have known shapes such as a cylindrical shape, a tapered shape, and the like. When the via included in each of the plurality of via layers 113 has a tapered shape, a portion of the via included in each of the plurality of via layers 113 may have a tapered shape in the same direction as each other, and the other portion thereof may have a tapered shape in the other direction. The vias included in each of the plurality of via layer 113 may also have a tapered shape in the same direction.

Meanwhile, a sum of the thicknesses of the first metal layer 120, the second metal layer 130, and the third metal layer 140 may be substantially the same as the thickness of the wiring layer 112 disposed on the first surface 110-1 of the substrate 110. Here, the sum of the thicknesses of the first metal layer 120, the second metal layer 130, and the third metal layer 140 may refer to a sum of thicknesses of portions of the first metal layer 120, the second metal layer 130, and the third metal layer 140 disposed on the first surface 110-1 of the substrate 110. Similarly, a sum of the thicknesses of the first metal layer 120, the second metal layer 130, and the third metal layer 140 may be substantially the same as the thickness of the wiring layer 112 disposed on the second surface 110-2 of the substrate 110. Here, the sum of the thicknesses of the first metal layer 120, the second metal layer 130, and the third metal layer 140 may refer to a sum of thicknesses of portions of the first metal layer 120, the second metal layer 130, and the third metal layer 140 disposed on the second surface 110-2 of the substrate 110. Substantially identical is a concept not only covering perfectly identical cases, but also a range of errors that may occur in structures and/or processes.

The through-via V may be connected to at least one of the plurality of wiring layers 112. Therefore, the through-via V may serve to connect a portion of the plurality of wiring layers 112 to each other.

Other details are substantially the same as those described in the printed circuit board 100A according to an example, and detailed descriptions thereof will be omitted.

Figure 6:
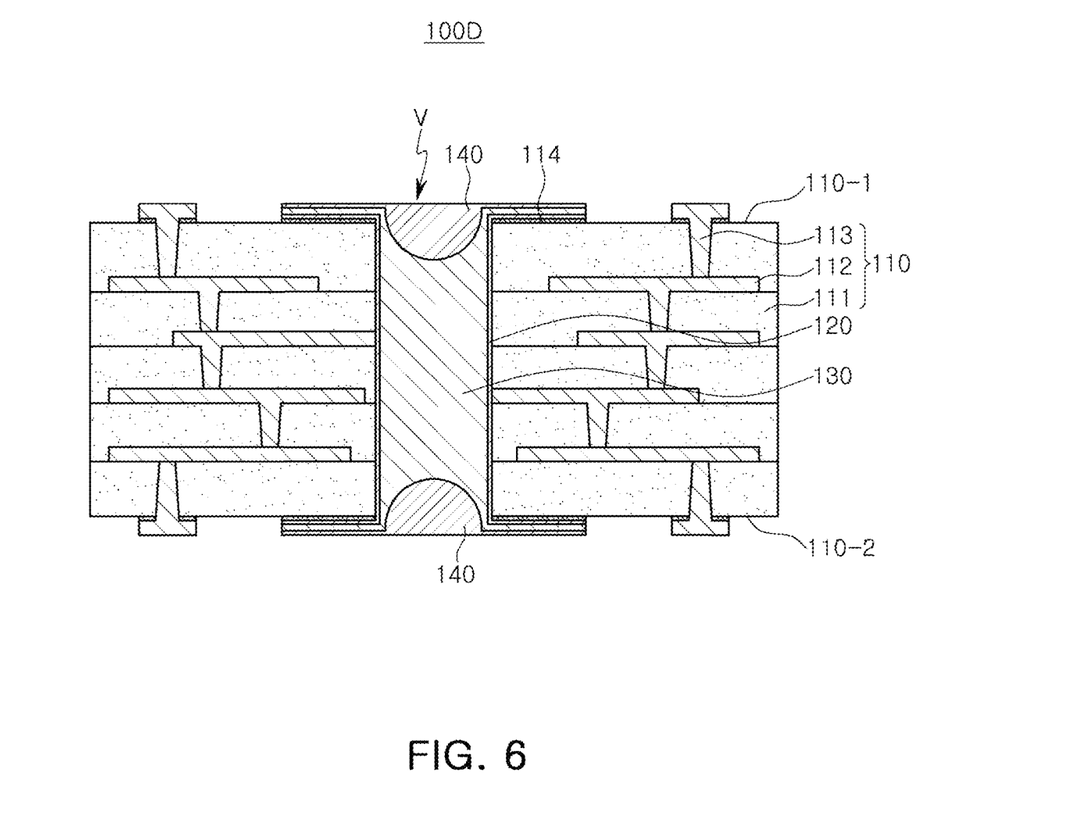
FIG. 6 is a schematic cross-sectional view of a printed circuit board 100D according to another example.

FIG. 6 is a schematic cross-sectional view of a printed circuit board 100D according to another example.

Referring to FIG. 6, the printed circuit board 100D according to another example may further include a fourth metal layer 114 disposed on the first surface 110-1 and the second surface 110-2 of the substrate 110, respectively, and being covered with the first metal layer 120, in the printed circuit board 100C according to an example.

As shown in the drawing, the fourth metal layer 114 may be also be disposed between the wiring layer 112 disposed on the first surface 110-1 of the substrate 110. Similarly, the fourth metal layer 114 may also be disposed between the wiring g layer 112 disposed on the second surface 110-2 of the substrate 110.

The substrate 110 may have an insulating layer 111 and a fourth metal layer 114, such as a metal foil, disposed on the insulating layer 111. For example, the substrate 110 may be a copper clad laminate (CCL) having a copper foil attached to one surface or both surfaces of the insulating layer 111.

Meanwhile, the unnecessary portion of the metal foil may be removed in a process such as etching, or the like, and the remaining metal foil after the removal process may become the fourth metal layer 114 shown in FIG. 6.

Other details are substantially the same as those described in the printed circuit board 100C according to an example, and detailed descriptions thereof will be omitted.

Figure 7:
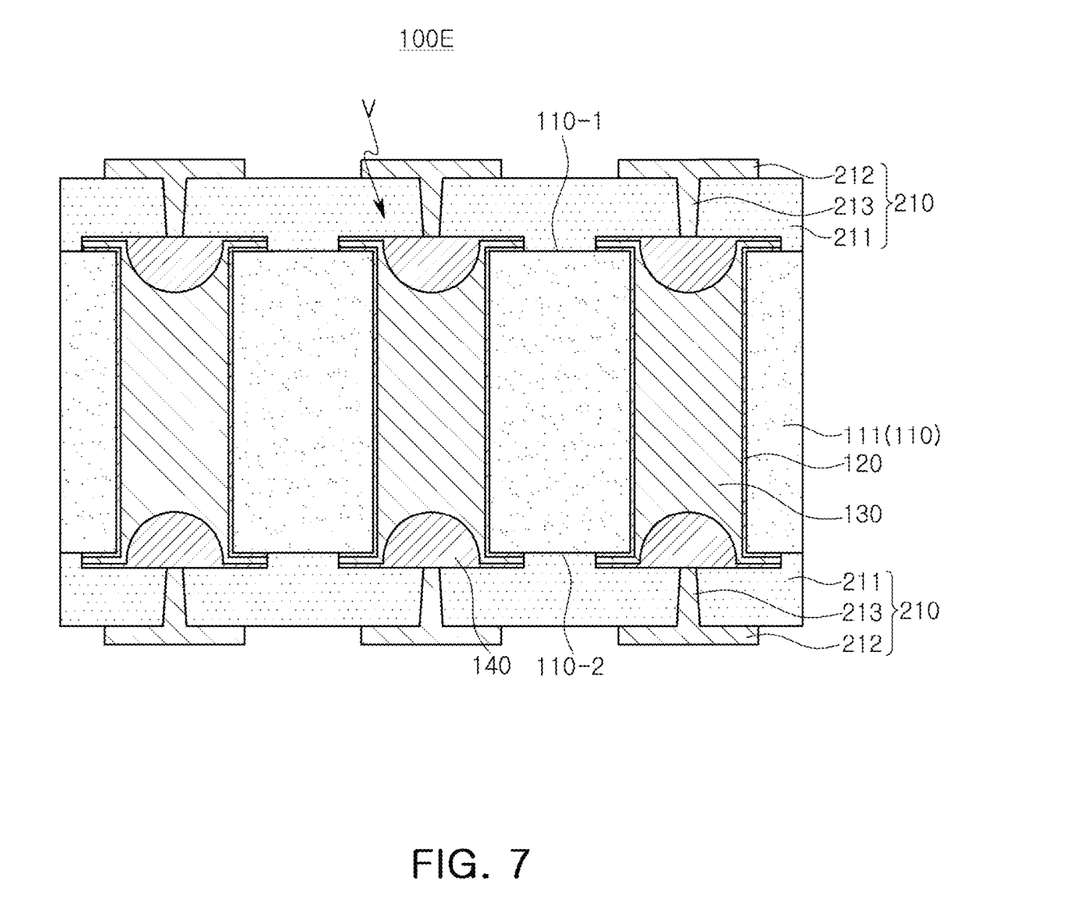
FIG. 7 is a schematic cross-sectional view of a printed circuit board 100E according to another example.

FIG. 7 is a schematic cross-sectional view of a printed circuit board 100E according to another example.

Referring to FIG. 7, the printed circuit board 100E according to another example may further include a build-up layer 210 disposed on the first surface 110-1 and the second surface 110-2 of the substrate 110, respectively, in the printed circuit board 100A according to an example.

The build-up layer 210 may include an insulating layer 211, a wiring layer 212 disposed on the insulating layer 211, and a via layer 213 penetrating the insulating layer 211 and connecting the through-via V and the wiring layer 212.

Although the build-up layer 210 is illustrated as being disposed on the first surface 110-1 and the second surface 110-2 of the substrate 110 in the drawings, the build-up layer 210 may be disposed only on any one surface of the first surface 110-1 and the second surface 110-2 of the substrate 110.

In addition, the number of each of the insulating layer 211, the wiring layer 212, and the via layer 213 included in the build-up layer 210 may be larger than that shown in the drawing. That is, each of the insulating layer 211, the wiring layer 212, and the via layer 213 may be a plurality of insulating layers 211, a plurality of wiring layers 212, and a plurality of via layers 213. In this case, the number of each of the insulating layer 211, the wiring layer 212, and the via layer 213 included in the build-up layer 210 may be the same or may be different from each other on the first surface 110-1 and the second surface 110-2 of the substrate 110, respectively.

Meanwhile, the substrate 110 may be a thick core substrate having a thickness, greater than the thickness of the insulating layer 211. The through-via V may be formed by a plating method according to an example, and thus, the through-via V penetrating the core substrate without voids may be formed.

As a formation material of the insulating layer 211, a thermosetting resin such as an epoxy resin, a thermoplastic resin such as a polyimide, or a resin in which these resins are impregnated with a core such as glass cloth or glass fabric, together with an inorganic filler, for example, a prepreg (prepreg), Ajinomoto Build-up Film (ABF), FR-4, Bismaleimide Triazine (BT), and the like, can be used. If necessary, a Photo Imagable Dielectric (PID) resin may be used.

The wiring layer 212 may provide several wirings. For example, the wiring layer 212 may include a ground pattern, a power pattern, a signal pattern, and the like.

As a formation material of the wiring layer 212, a metal material such as copper (Cu), aluminum (Al), silver (Ag), tin (Sn), gold (Au), nickel (Ni), lead (Pb), titanium (Ti), or alloys thereof may be used.

A via layer 213 may perform various functions depending on designs. For example, the via layer 213 may include a connection via for signal connection, a connection via for ground connection, a connection via for power connection, and the like.

As a formation material of a via included in the via layer 213, a conductive material such as copper (Cu), aluminum (Al), silver (Ag), tin (Sn), gold (Au), nickel (Ni), lead (Pb), titanium (Ti), or alloys thereof may be used. The via included in the via layer 213 may be a filled type via in which an interior of the via hole is completely filled with a conductive material. When the via is formed as a conductive material is formed along the wall of the via hole, the interior of the via hole may be filled with an insulating material.

The via included in the via layer 213 may have a known shape such as a cylindrical shape, a tapered shape, and the like.

Figure 8:
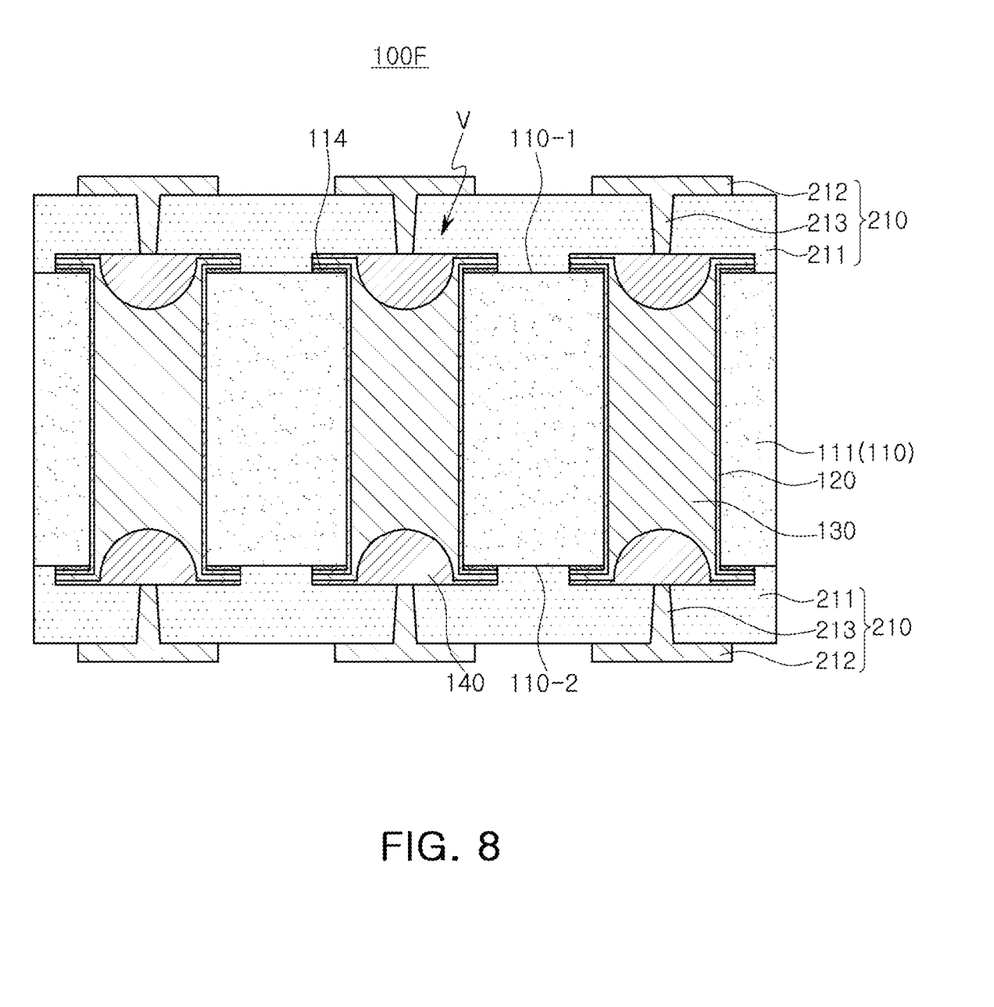
FIG. 8 is a schematic cross-sectional view of a printed circuit board 100F according to another example.

FIG. 8 is a schematic cross-sectional view of a printed circuit board according to another example.

Referring to FIG. 8, a printed circuit board 100D according to another example may further include a fourth metal layer 114 disposed on a first surface 110-1 and a second surface 110-2, respectively, of the substrate 110, and being covering with the first metal layer 120, in the printed circuit board 100C according to another example.

As shown FIG. 8, the fourth metal layer 114 may also be disposed between the wiring layers 112 disposed on the first surface 110-1 of the substrate 110. Similarly, the second surface 110-2 of the substrate 110 may also be disposed between the wiring layers 112 disposed on the second surface 110-2 of the substrate 110.

The substrate 110 may have an insulating layer 111 and a fourth metal layer 114, such as a metal foil, disposed on the insulating layer 111. For example, the substrate 110 may be a copper clad laminate (CCL) having a copper foil attached to one surface or both surfaces of the insulating layer 111.

Meanwhile, the unnecessary portion of the metal foil may be removed in a process such as etching, or the like, and the remaining metal foil after the removal process may become the fourth metal layer 114 shown in FIG. 8.

Other details are substantially the same as those described in the printed circuit board 100E according to another example, and thus detailed descriptions thereof will be omitted.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items. It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

As set forth above, according to an embodiment of the present disclosure, a printed circuit board including a filled-type through-via without voids may be provided.

According to another aspect of the present disclosure, a printed circuit board having improved heat dissipation characteristics and reliability may be provided.

While exemplary embodiments have been shown and described above, it will be apparent to those skilled in the art that modifications and variations could be made without departing from the scope of the present invention as defined by the appended claims.

What is claimed is:

1. A printed circuit board, comprising:
a substrate having a first surface and a second surface, opposite to the first surface, and having a through-portion penetrating between the first surface and the second surface; and
a through-via disposed in at least a portion of the through-portion,
wherein the through-via comprises a first metal layer having a first groove portion facing an interior of the through-portion from the first surface of the substrate and a second groove portion facing the interior of the through-portion from the second surface of the substrate, and
the first metal layer has a first region, and a second region, having different average grain sizes.

2. The printed circuit board of claim 1, wherein the first region of the first metal layer comprises a first-first region facing an interior of the first metal layer from a surface of the first groove portion and a first-second region facing the interior of the first metal layer from a surface of the second groove portion,
the second region of the first metal layer is disposed between the first-first region and the first-second region, and
each average grain size in the first-first region and the first-second region is greater than an average grain size in the second region.

3. The printed circuit board of claim 2, wherein a sum of a thickness of the first-first region and a thickness of the first-second region is greater than a thickness of the second region between the first-first region and the first-second region.

4. The printed circuit board of claim 3, wherein each of the thickness of the first-first region and the thickness of the first-second region is greater than the thickness of the second region between the first-first region and the first-second region.

5. The printed circuit board of claim 2, wherein the first-first region of the first metal layer has a convex shape in which a width of a cross-section decreases after increasing from the surface of the first groove portion facing the interior of the first metal layer, and the first-second region of the first metal layer has a convex shape a width of a cross-section decreases after increasing from the surface of the second groove portion facing the interior of the first metal layer.

6. The printed circuit board of claim 2, wherein the first metal layer further comprises a third region including a third-first region extending from a wall surface of the through-portion and surrounding at least a portion of the first-first region and a third-second region extending from the wall surface of the through-portion and surrounding at least a portion of the first-second region.

7. The printed circuit board of claim 1, wherein the through-via further comprises a second metal layer disposed on the first metal layer, and the second metal layer is disposed in at least a portion of each of the first groove portion and the second groove portion.

8. The printed circuit board of claim 7, wherein a thickness of the first metal layer is greater than a sum of a thickness of a region disposed in the first groove portion of the second metal layer and a thickness of a region disposed in the second groove portion of the second metal layer.

9. The printed circuit board of claim 7, wherein a thickness of the first metal layer is greater than a thickness of a region disposed in the first groove portion of the second metal layer and a thickness of a region disposed in the second groove portion of the second metal layer, respectively.

10. The printed circuit board of claim 7, wherein each of the first metal layer and the second metal layer extends on the first surface of the substrate and the second surface of the substrate, respectively.

11. The printed circuit board of claim 10, further comprising a third metal layer disposed on a wall surface of the through-portion, the first surface of the substrate, and the second surface of the substrate, respectively, the third metal layer being covered with the first metal layer.

12. The printed circuit board of claim 11, wherein the through-via further comprises a fourth metal layer disposed on the first surface of the substrate and second surface of the substrate, respectively, the fourth metal layer being covered with the third metal layer.

13. The printed circuit board of claim 1, wherein the substrate comprises a plurality of insulating layers, a plurality of wiring layers disposed on each of the plurality of insulating layers, respectively, and a plurality of via layers respectively penetrating of the plurality of insulating layers and connecting of the plurality of wiring layers to each other.

14. The printed circuit board of claim 13, wherein the through-via is connected to at least one of the plurality of wiring layers.

15. The printed circuit board of claim 1, further comprising a build-up layer including an insulating layer disposed on at least one surface of the first surface or the second surface of the substrate, a wiring layer disposed on the insulating layer, and a via layer penetrating the insulating layer and connecting the through-via and the wiring layer, wherein a thickness of the substrate is greater than a thickness of the insulating layer.

16. A printed circuit board, comprising:

a substrate having a first surface and a second surface, opposite to the first surface, and having a through-portion penetrating between the first surface and the second surface; and a through-via disposed in at least a portion of the through-portion, wherein the through-via comprises first grains and second grains, a region, in which the first grains are disposed, is disposed between regions in which the second grains are disposed, the first grains and the second grains having different average grain sizes, and a width of each of the regions in which the second grains are disposed, first increases and then decreases in a direction from the first surface to second surface or from the second surface to the first surface.

17. The printed circuit board of claim 16, wherein the average grain size of the first grains is less than the average grain size of the second grains.

18. The printed circuit board of claim 16, wherein the regions, in which the second grains are disposed, each has a groove portion facing an interior of the through-portion.

19. The printed circuit board of claim 18, further comprising a metal layer disposed in each groove portion.

20. The printed circuit board of claim 19, wherein an average grain size of grains in the metal layer is less than the average grain size of the second grains.

* * * * *